United States Patent [19]

Bennett

[11] Patent Number: 4,581,592
[45] Date of Patent: Apr. 8, 1986

[54] SAW STABILIZED OSCILLATOR WITH CONTROLLED PULL-RANGE

[75] Inventor: Ralph C. Bennett, Carrollton, Tex.

[73] Assignee: R F Monolithics, Inc., Dallas, Tex.

[21] Appl. No.: 491,078

[22] Filed: May 3, 1983

[51] Int. Cl.$^4$ .............................................. H03B 5/24
[52] U.S. Cl. ........................ 331/107 A; 331/117 FE; 331/177 V
[58] Field of Search ...... 331/107 A, 116 FE, 117 FE, 331/177 V

[56] References Cited

U.S. PATENT DOCUMENTS

| 3,855,548 | 12/1974 | Nandi et al. | 331/107 A |
|---|---|---|---|
| 4,011,526 | 3/1977 | Kinsman | 331/107 A |
| 4,085,388 | 4/1978 | Gilden et al. | 331/107 A |
| 4,233,573 | 11/1980 | Grudkowski | 331/107 A |
| 4,249,146 | 2/1981 | Yen et al. | 331/107 A X |

FOREIGN PATENT DOCUMENTS 1446061  8/1976  United Kingdom ........... 331/107 A

OTHER PUBLICATIONS

Leja, I., "High Efficiency Saw Oscillator Using Dual Gate GaAs FET", IEEE Proceedings-1979 Ultrasonics Symposium (26-28 Sep. '79) pp. 865-869.

Primary Examiner—Eugene R. LaRoche
Assistant Examiner—Robert J. Pascal
Attorney, Agent, or Firm—Kanz, Scherback & Timmons

[57] ABSTRACT

An oscillator including an active device (38), a surface acoustic wave resonator (40) connected in a feedback relationship to the active device and an impedance matching circuit is disclosed. The impedance matching circuit in one arrangement is an output impedance matching circuit including an inductor (46) connected in the feedback loop to the output of the active device. In another arrangement, the impedance matching network is an input impedance matching network including an inductor (42) connected in the feedback loop to the input of the active device. In another arrangement of the invention, a varactor diode (60) is connected in the feedback loop and is controlled by a reverse voltage which changes the capacitance of the diode, adjusting the frequency of the oscillator.

13 Claims, 4 Drawing Figures

SAW STABILIZED OSCILLATOR WITH CONTROLLED PULL-RANGE

TECHNICAL FIELD

The present invention relates generally to oscillators and in one of its aspects to oscillators which can operate from ten megahertz to over one gigahertz with controlled pull-range.

Surface acoustic wave devices known as SAW devices have many uses in the the UHF and VHF frequency ranges. SAW devices are especially useful as resonators in these frequency ranges.

BACKGROUND ART

The original criteria for a feedback oscillator, credited to Barkhausen, establishes that two conditions must be met in order for a circuit to sustain oscillations. The first is that the gain around the loop be greater than unity, and the second is that the loop phase be an integer multiple of 360°. The two major types of devices used in these applications are delay lines and resonators. Surface acoustic wave devices have been used in feedback radio frequency oscillators as delay lines as shown in U.S. Pat. No. 3,868,595 of Capps et al. A principal disadvantage of the delay line is that a fixed phase slope is established during the design of the device by the physical spacing between the input and output transducers. The phase slope has a reciprocal correspondence with the physical spacing which is to say that for a delay line to have a steep phase slope, the device would need to be extremely long. The phase slope determined by the physical spacing is a fixed parameter in the design of the oscillator and establishes the oscillator frequency at the point along this phase slope where the loop phase criteria are met. In order to shift or pull this frequency of oscillation from the established point, additional phase shift elements must be added to the circuit to force the oscillation to occur at a different point on the phase slope while maintaining the original integer multiple of 360° loop requirement.

A SAW resonator includes one or more transducers within a resonant cavity formed by distributed SAW reflecting arrays. The reflection coefficient of these arrays can readily exceed 99 percent, and the electrical Q of the resonator is determined by dissipative losses, either within the device or in external circuitry. A resonant cavity exhibits a 90° phase shift between the three dB bandwidth determined from the Q. The higher the device Q, therefore, the steeper is the phase slope.

Resonator oscillators are also well known in the art. Bulk mode crystals are used from a few kilohertz to less than 21 megahertz fundamental frequency and can have third to fifteenth overtones giving a 300 megahertz frequency. A free running oscillator can be phase locked to a lower frequency. SAW resonator oscillators are also known which use impedance transparent phase shifters as shown in 1976 *Ultrasonics Symposium Proceedings*, IEEE Cat. #76 CH 1120-5SU "Voltage Controlled Surface Wave Resonator Oscillators" by Lawrence Ragan.

DISCLOSURE OF INVENTION

An oscillator according to the present invention includes some form of active device or amplifier such as an operational amplifier, transistor or MOSFET, a surface acoustic wave resonator connected in a feedback relationship to the active device and impedance matching networks between the active device and the resonator to electrically establish a desired operating impedance environment for the resonator and thereby establish a controlled tuning sensitivity to loop phase perturbations. This controlled tuning capability allows for a reduction in the manufacturing frequency tolerances of SAW resonators while still providing the capability to tune the oscillator to an exact frequency within the tolerance, thereby potentially reducing the overall cost of the oscillator circuit. The impedance matching networks also provide additional phase shift so that the total phase shift around the loop be sufficient to cause oscillation. The impedance matching network may be either a series type of matching such as pi, tee or L sections or shunt type matching such as tapped inductors or capacitors or combinations of both types of networks.

In one arrangement, the impedance matching circuit includes a varactor diode connected in the feedback loop with the SAW resonator and a means for applying an adjustable reverse voltage across the varactor. The oscillator can be electrically tuned by adjusting the reverse voltage applied.

These and other objects, advantages and features of this invention will be apparent from the following description taken with reference to the accompanying drawings, wherein is shown the preferred embodiments of the invention.

BEST MODE FOR CARRYING OUT THE INVENTION

Figure 1:
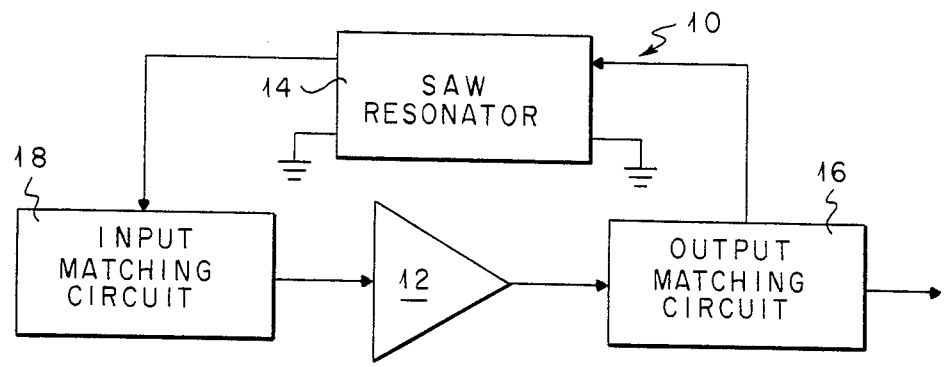
FIG. 1 is a block diagram representation of an oscillator according to the present invention.

Referring now to the drawing, and in particular to FIG. 1, an oscillator in accordance with the present invention is referred to generally by reference numeral 10. Oscillator 10 includes what is variously known as an active device, amplifying device or amplifier 12 which might be a transistor, an operational amplifier, a MOSFET or other active device or a complete amplifier circuit. A SAW resonator 14 is connected in a feedback relationship to active device 12 so that the active device and the SAW resonator form part of a feedback loop. An impedance matching circuit including output matching circuit 16 and input matching circuit 18 is electrically connected to active device 12 for providing the desired impedance environment for the resonator and the additional phase shift for the total phase shift around the feedback loop to be sufficient to cause oscillation. SAW resonator 14 can be configured during final packaging to have either 180° or 0° transmission phase shift, making it possible to use either an inverting or non-inverting amplifier configuration for active device 12. In the alternative, SAW resonator can be a one port resonator. Such a one port resonator can be constructed from a 180° two port resonator with the input port connected in parallel to the output port. Since amplifiers at UHF frequencies do not exhibit perfect 180° or 0° transmission phase shifts, it is necessary to include some phase shift in the impedance matching circuits 16 and 18. The total phase shift around the feedback loop is thus substantially an integer multiple of 360°. Since SAW resonator 14 has a phase slope that is determined by the impedance level of its environment, the phase slope can be controlled by controlling the impedance of the external circuit, in this case impedance matching circuits 16 and 18. A loop oscillator according to the present invention can be configured with an active device, series type matching networks and a resonator that is capable of being adjusted to an exact predetermined frequency, thereby allowing for frequency tolerances in resonator device manufacturing. The series-type matching networks used in conjuction with the resonator provide the impedance transformation between the active device and the resonator as well as provide a phase adjustment mechanism to set the exact frequency. These circuits are implemented by using three element matching with both the impedance transmission and the transmission phase specified in the design. The third element can sometimes be absorbed in the parasitic circuit values and thereby appears to be only two element matching while still actually providing the desired transmission phase.

Figure 2:
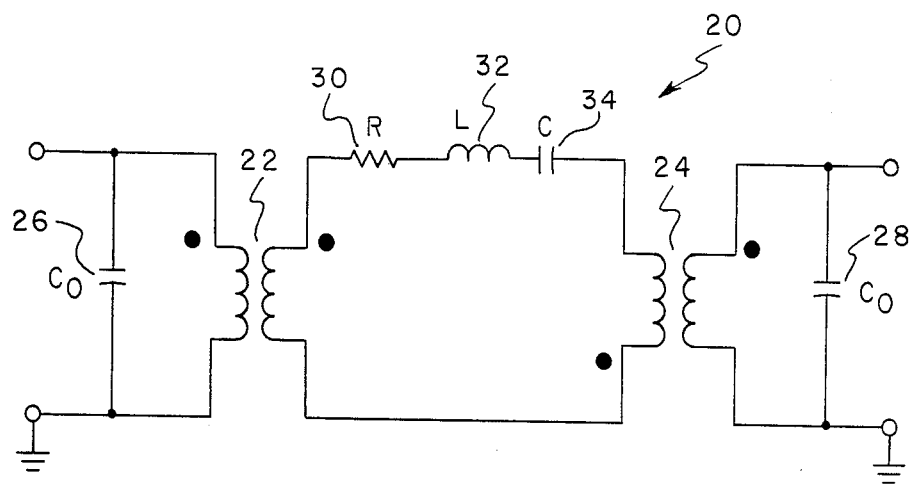
FIG. 2 is an equivalent circuit representation of a 180° SAW resonator.
Figure 3:
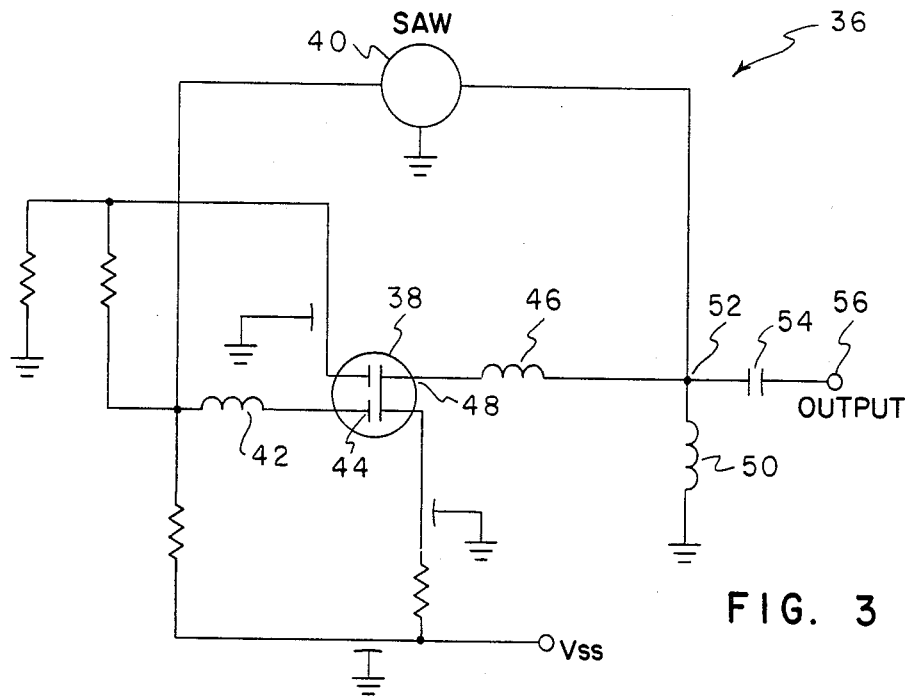
FIG. 3 is a circuit diagram representation of an oscillator in accordance with the present invention.

Referring now to FIG. 2, the equivalent circuit to SAW resonator 14 is referred to generally by reference numeral 20. The electrical decoupling of the SAW resonator is represented by inverting and non-inverting transformers 22 and 24, and capacitors 26 and 28 represent the parasitic capacitance of the device. The equivalent series resistance, inductance and capacitance are represented by resistor 30, inductor 32 and capacitor 34 respectively. Referring also to FIG. 3, another arrangement of the present invention is referred to generally by reference numeral 36. Oscillator 36 includes an active device which is a dual gate ultra-high frequency MOSFET 38 and a 180° transmission phase shift SAW resonator 40 connected in a feedback relationship to the MOSFET. An input impedance matchine network includes inductor 42 connected between gate 44 of MOSFET 38 and the feedback loop. In actuality, the parasitic capacitance at gate 44 and at the output of SAW resonator 40 form a part of the matching circuitry. An output impedance matching network includes inductor 46 connected between drain 48 of MOSFET 38 and the feedback loop. Similarly, the parasitic capacitance at drain 48 and the input of SAW resonator 40 form a part of the impedance matching. Inductor 50 connected between oscillator output 52 and ground is a radio frequency choke which shorts the DC to ground but blocks the oscillation frequency. A decoupling capacitor 54 is also connected to output 52 to decouple any direct current from AC output 56. It can now easily be seen that in such an oscillator according to the present invention, the frequency of the oscillator can be adjusted by adjusting the inductance of one of the inductors. Conceivably this could be done by simply spreading or squeezing turns together of an inductance coil.

Figure 4:
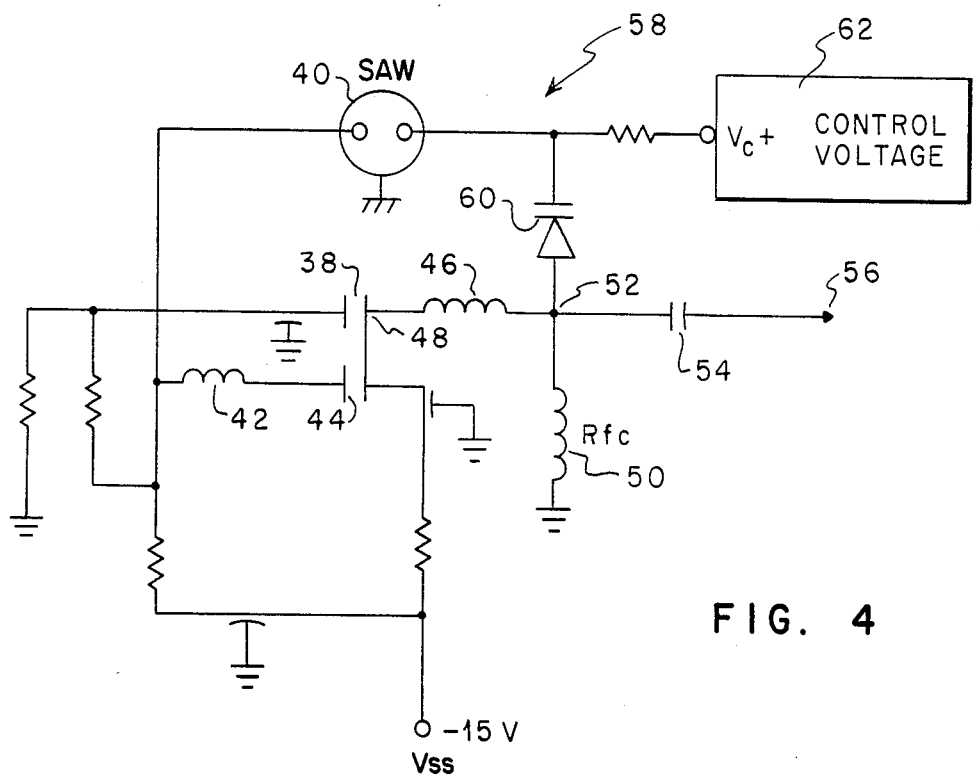
FIG. 4 is a circuit diagram representation of another embodiment of an oscillator in accordance with the present invention.

Referring now to FIG. 4, yet another alternative embodiment of an oscillator according to the present invention is referred to generally by reference numeral 58 where similar elements are given the same numbers as in the embodiment shown in FIG. 3. Oscillator 58 also includes a varactor connected in the feedback loop between output 52 and the input of SAW resonator 40 and means 62 for applying an adjustable reverse voltage across varactor diode 60. Such an adjustable reverse voltage across the varactor changes the capacitance of the varactor, thus changing the impedance matching network phase shift and adjusting the operating frequency of oscillator 58. The oscillator can thus be tuned by adjusting the reverse voltage applied across varactor diode 60.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the figures of the accompanying drawings is to be interpreted as illustrative and not in a limiting sense.

I claim:
1. An oscillator comprising in combination: an amplifier;
   a surface acoustic wave resonator connected in a feedback relationship to the amplifier whereby the amplifier and the surface acoustic wave resonator form part of a feedback loop; and
   means electrically connected to the amplifier for providing additional phase shift for the total phase shift around the feedback loop to be sufficient to cause oscillation at a predetermined frequency which is different from the center frequency of the surface acoustic wave resonator.

2. An oscillator according to claim 2 wherein the means for providing additional phase shift provides the impedance environment for determining the loaded Q of the resonator and the additional phase shift for the total phase shift around the feedback loop of substantially an integer multiple of 360°.

3. An oscillator according to claim 2 wherein the means for providing additional phase shift includes:
   a varactor diode connected in the feedback loop with the surface acoustic wave resonator; and
   means for applying an adjustable reverse voltage across the varactor wherein the oscillator can be tuned by adjusting the reverse voltage applied across the varactor.

4. An oscillator comprising in combination:
   an active device:
   a surface acoustic wave resonator connected in a feedback relationship to the active device whereby the active device and the surface acoustic wave resonator form part of a feedback loop; and
   an output means for substantially affecting the operating loaded Q of the resonator and changing the phase shift around the feedback loop to a frequency which is different from the center frequency of the surface acoustic wave resonator.

5. An oscillator according to claim 4 wherein the active device is a dual gate ultra high frequency MOSFET connected in an inverting configuration and the surface acoustic wave resonator is configured for substantially 180° transmission phase shift.

6. An oscillator according to claim 5 wherein the output means for substantially affecting the operating loaded Q includes:

a varactor diode connected in the feedback loop with the surface acoustic wave resonator; and means for applying adjustable reverse voltage across the varactor wherein the oscillator can be tuned by adjusting the reverse voltage applied across the varactor.

7. An oscillator according to claim 6 further including an input means for substantially affecting the operating loaded Q of the resonator and changing the phase shift around the feedback loop to a frequency which is different from the center frequency of the surface acoustic wave resonator.

8. An oscillator according to claim 7 wherein the input means for substantially affecting the loaded Q comprises an inductor connected in the feedback loop to one gate of the MOSFET and the output means for substantially affecting the loaded Q comprises an inductor connected to the drain of the MOSFET in the feedback loop.

9. An oscillator according to claim 4 wherein the output means for substantially affecting the loaded Q includes:

a varactor diode connected in the feedback loop with the surface acoustic wave resonator; and means for applying an adjustable reverse voltage across the varactor wherein the oscillator can be tuned by adjusting the reverse voltage applied across the varactor.

10. An oscillator according to claim 9 further including an input means substantially affecting the loaded Q of the resonator and changing the phase shift around the feedback loop.

11. An oscillator according to claim 10 wherein the input means for substantially affecting the loaded Q comprises an inductor connected in the feedback loop to the input of the active device and the output means for substantially affecting the loaded Q comprises an inductor connected to the output of the active device in the feedback loop for the purpose of controlling the loaded Q of the resonator.

12. An oscillator according to claim 4 further including an input means for substantially affecting the loaded Q which substantially affects the loaded Q of the resonator and changes the phase shift around the feedback loop.

13. An oscillator according to claim 12 wherein the input means for substantially affecting the loaded Q comprises an inductor connected in the feedback loop to the input of the active device and the output means for substantially affecting the loaded Q comprises an inductor connected to the output of the active device in the feedback loop.

* * * * *

UNITED STATES PATENT AND TRADEMARK OFFICE
CERTIFICATE OF CORRECTION

PATENT NO. : 4,581,592
DATED : April 8, 1986
INVENTOR(S) : Ralph C. Bennett

It is certified that error appears in the above-identified patent and that said Letters Patent is hereby corrected as shown below:

In Column 3, line 40, "matchine" should read ---matching---
In Column 4, line 36, "claim 2" should read ---claim 1---

Signed and Sealed this

Fifteenth Day of July 1986

[SEAL]

Attest:

DONALD J. QUIGG

Attesting Officer

Commissioner of Patents and Trademarks